United States Patent
Iizuka et al.

(10) Patent No.: US 11,476,132 B2
(45) Date of Patent: Oct. 18, 2022

(54) SEALING STRUCTURE, VACUUM PROCESSING APPARATUS AND SEALING METHOD

(71) Applicant: TOKYO ELECTRON LIMITED, Tokyo (JP)

(72) Inventors: Hachishiro Iizuka, Nirasaki (JP); Masahisa Watanabe, Nirasaki (JP); Yuichiro Wagatsuma, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/918,774

(22) Filed: Jul. 1, 2020

(65) Prior Publication Data
US 2021/0005482 A1 Jan. 7, 2021

(30) Foreign Application Priority Data
Jul. 3, 2019 (JP) .............................. JP2019-124692

(51) Int. Cl.
*H01L 21/67* (2006.01)

(52) U.S. Cl.
CPC .. *H01L 21/67126* (2013.01); *H01L 21/67098* (2013.01)

(58) Field of Classification Search
CPC ......... H01L 21/67126; H01L 21/67098; H01L 21/67103; H01L 21/67017; C23C 16/4409; C23C 16/45561; C23C 14/56; F16J 15/064; F16J 15/104; F16L 39/005
See application file for complete search history.

(56) References Cited

U.S. PATENT DOCUMENTS

| | | | | |
|---|---|---|---|---|
| 5,997,963 | A * | 12/1999 | Davison | .............. C23C 16/4409 427/582 |
| 6,457,228 | B1 * | 10/2002 | Arai | .......................... G06F 1/20 174/17.06 |
| 6,603,130 | B1 * | 8/2003 | Bisschops | ........... G03F 7/70816 250/492.1 |

(Continued)

FOREIGN PATENT DOCUMENTS

| | | |
|---|---|---|
| JP | H07-068152 A | 3/1995 |
| JP | 2004-099924 A | 4/2004 |

(Continued)

*Primary Examiner* — Mohammed Shamsuzzaman
(74) *Attorney, Agent, or Firm* — Fenwick & West LLP

(57) ABSTRACT

A sealing structure of a gas supply line assembly connected to a processing chamber for processing a substrate in a vacuum atmosphere is provided. The sealing structure includes a first pipe member constituting the gas supply line assembly and having an end surface where an opening communicating with the processing chamber is formed, a second pipe member constituting the gas supply line assembly and having a facing surface facing the end surface of the first pipe member, and a sealing member made of an elastomer disposed between the end surface of the first pipe member and the facing surface of the second pipe member to surround the opening. The sealing structure further includes a sheet-shaped porous member disposed between the end surface of the first pipe member and the facing surface of the second pipe member to surround a vicinity of the sealing member.

7 Claims, 7 Drawing Sheets

(56) References Cited

U.S. PATENT DOCUMENTS

| | | | | |
|---|---|---|---|---|
| 2002/0174882 A1* | 11/2002 | Kimura | ............ | H01L 21/67028 |
| | | | | 134/21 |
| 2004/0160157 A1* | 8/2004 | Takikawa | .............. | C01B 32/162 |
| | | | | 313/346 R |
| 2004/0250980 A1* | 12/2004 | Nakayama | ......... | B22D 11/0622 |
| | | | | 164/428 |
| 2006/0071607 A1* | 4/2006 | Chen | ................... | H01J 37/3222 |
| | | | | 315/111.01 |
| 2009/0300939 A1* | 12/2009 | Kennedy | ................ | D06B 23/18 |
| | | | | 34/474 |
| 2011/0303361 A1* | 12/2011 | Ohmi | .................. | C23C 16/4409 |
| | | | | 156/345.1 |
| 2015/0165475 A1* | 6/2015 | Palm | ........................ | B05D 1/60 |
| | | | | 427/591 |
| 2017/0198395 A1* | 7/2017 | Nozawa | .............. | H01L 21/3065 |
| 2019/0198296 A1* | 6/2019 | Lu | ..................... | H01J 37/32834 |
| 2020/0003695 A1* | 1/2020 | Horiike | .................. | G01N 30/84 |
| 2020/0328096 A1* | 10/2020 | Eto | .................... | H01L 21/68707 |

FOREIGN PATENT DOCUMENTS

| | | | |
|---|---|---|---|
| JP | 2007-009939 A | | 1/2007 |
| JP | 2020031176 A | * | 2/2020 |

* cited by examiner

SEALING STRUCTURE, VACUUM PROCESSING APPARATUS AND SEALING METHOD

CROSS-REFERENCE TO RELATED APPLICATIONS

This application claims priority to Japanese Patent Application No. 2019-124692, filed on Jul. 3, 2019, the entire contents of which are incorporated herein by reference.

TECHNICAL FIELD

The present disclosure relates to a sealing structure, a vacuum processing apparatus, and a sealing method.

BACKGROUND

In a semiconductor device manufacturing process, a vacuum processing apparatus for performing a process, e.g., film formation or the like, on a substrate in a vacuum atmosphere is used. Such a vacuum processing apparatus includes a vacuum chamber for forming a vacuum atmosphere, a gas supply line for supplying a film forming gas to the vacuum chamber, a gas exhaust line for exhausting the vacuum chamber, and the like. In the case of assembling the vacuum processing apparatus by connecting members forming the vacuum chamber and the gas exhaust line, a sealing structure for sealing a connecting portion is used to prevent inflow of air into the vacuum chamber and/or the gas exhaust line from the connecting portion.

In order to airtightly seal an opening of the vacuum chamber using the sealing structure, the sealing structure has an O-ring disposed to be in contact with a sealing surface around the opening of the vacuum chamber. Particularly, an elastomer O-ring having excellent heat resistance and corrosion resistance is used. However, the sealing structure using the elastomer O-ring is disadvantageous in that a gas, e.g., air, penetrates through the O-ring. Therefore, there is a demand for a sealing structure capable of suppressing the penetration of air through the O-ring.

Japanese Patent Application Publication No. 2004-99924 discloses a configuration in which an outer sealing member and an inner sealing member (O-ring) are respectively inserted into an outer groove and an inner groove that are concentrically formed at a contact portion where a cylindrical wall member is brought into contact with a ceiling plate that blocks an opening of the cylindrical wall member in order to seal the gap between the cylindrical wall and the ceiling plate. Further, the inflow of air into the opening is suppressed by filling an inert gas to a region between the outer sealing member and the inner sealing member.

In addition, Japanese Patent Application Publication No. H07-68152 discloses a technique for suppressing penetration of air through sealing members (O-rings) respectively disposed in an inner groove and an outer groove by setting an atmosphere between the sealing members to a vacuum atmosphere.

In view of the above, the present disclosure provides a technique for suppressing air from penetrating through an elastomer sealing member in the case of performing sealing with the elastomer sealing member.

SUMMARY

In accordance with an aspect of the present disclosure, there is provided a sealing structure of a gas supply line assembly connected to a processing chamber for processing a substrate in a vacuum atmosphere, including: a first pipe member constituting the gas supply line assembly and having an end surface where an opening communicating with the processing chamber is formed; a second pipe member constituting the gas supply line assembly and having a facing surface facing the end surface of the first pipe member; a sealing member made of an elastomer disposed between the end surface of the first pipe member and the facing surface of the second pipe member to surround the opening; and a sheet-shaped porous member disposed between the end surface of the first pipe member and the facing surface of the second pipe member to surround a vicinity of the sealing member.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
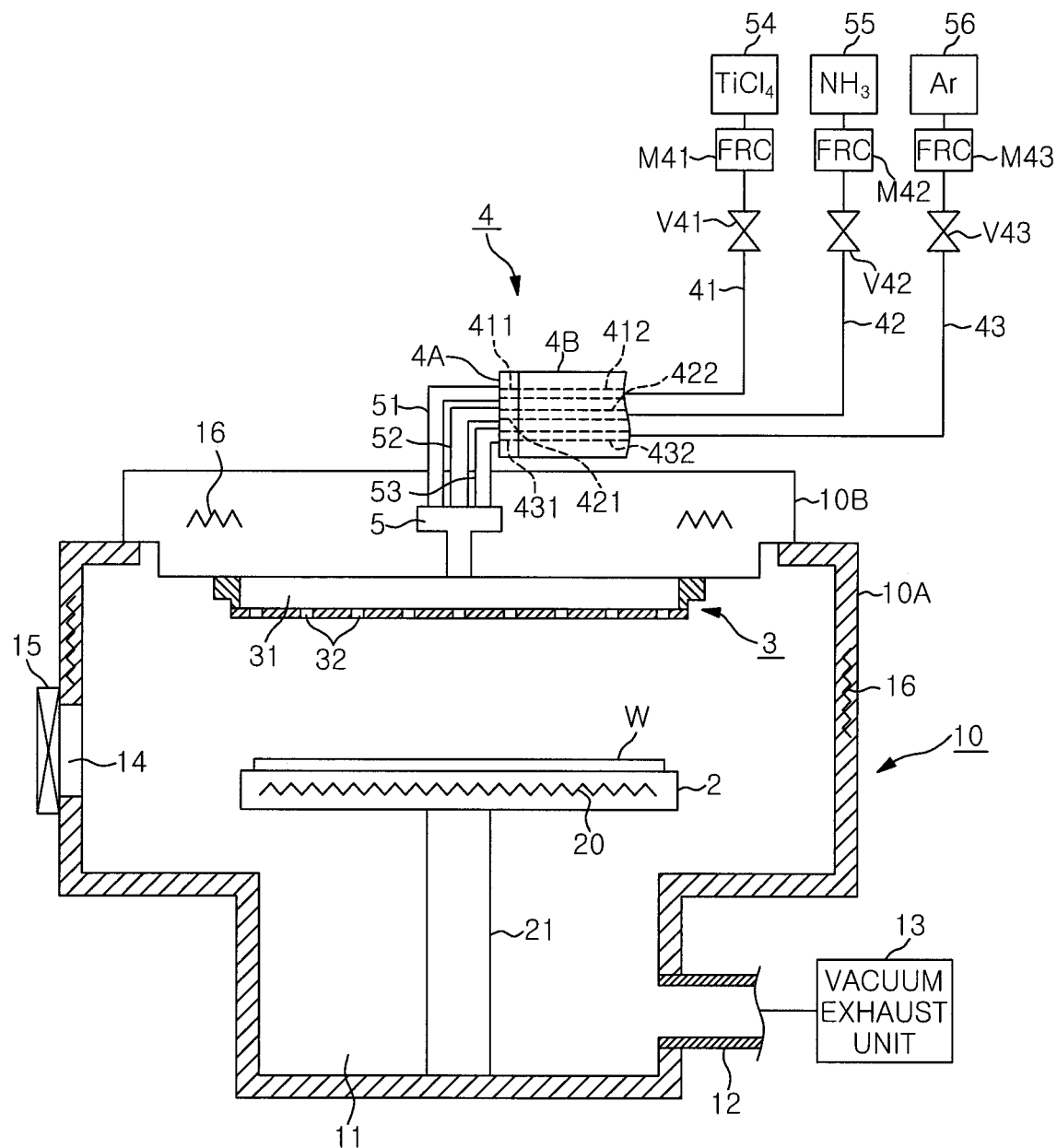
FIG. 1 is a side view of a vacuum processing apparatus according to an embodiment.

A film forming apparatus to which a sealing structure of the present disclosure is applied will be described. As shown in FIG. 1, the film forming apparatus includes a vacuum chamber 10 that is a processing chamber for processing a semiconductor wafer (hereinafter simply referred to as "wafer") W that is a substrate in a vacuum atmosphere, and a gas supply line assembly 4 for supplying a processing gas into the vacuum chamber 10. As will be described later, the gas supply line assembly 4 is formed by connecting a plurality of pipe members (first pipe member 4A and second pipe member 4B), and a sealing structure is provided therewith to suppress inflow of air into the gas supply line assembly 4 through a connecting portion of the pipe members.

The vacuum chamber 10 includes a substantially cylindrical chamber main body 10A having an upper opening and a ceiling plate 10B that blocks the upper opening of the chamber main body 10A. A cylindrical gas exhaust chamber 11 extends downward from the center of a bottom surface of the vacuum chamber 10, and a gas exhaust line 12 is connected to a side surface of the gas exhaust chamber 11. A vacuum exhaust unit 13 including a pressure control valve, e.g., a butterfly valve, or the like is connected to the gas exhaust line 12, so that a pressure in the vacuum chamber 10 can be decreased to a predetermined vacuum level. The wafer W is processed in an inner space of the vacuum chamber 10 configured as described above.

A transfer port 14 for loading and unloading the wafer W into and from a transfer chamber (not shown) is formed on a side surface of the vacuum chamber 10. The transfer port 14 can be opened and closed by a gate valve 15. A heating unit 16 for heating the vacuum chamber 10 is embedded in a wall of the vacuum chamber 10. A mounting table 2 for holding the wafer W substantially horizontally is disposed in the vacuum chamber 10. The mounting table 2 is supported by a support 21 extending upward from a bottom portion of the gas exhaust chamber 11. A heating unit 20 is embedded in the mounting table 2 to heat the wafer W to a set temperature.

Next, the ceiling plate 10B will be described. A flat disc-shaped shower head 3 for supplying a processing gas toward the wafer W is disposed on a bottom surface of the ceiling plate 10B. A diffusion space 31 for diffusing a gas is formed in the shower head 3, and gas injection holes 32 for injecting a gas toward the wafer W are distributed on the bottom surface of the shower head 3. A mixing unit 5 for mixing gases is disposed in the ceiling plate 10B. The mixing unit 5 communicates with the diffusion space 31 of the shower head 3 and is configured to supply the gas mixed in the mixing unit 5 into the diffusion space 31. A heating unit 16 is embedded in the ceiling plate 10B.

Figure 2:
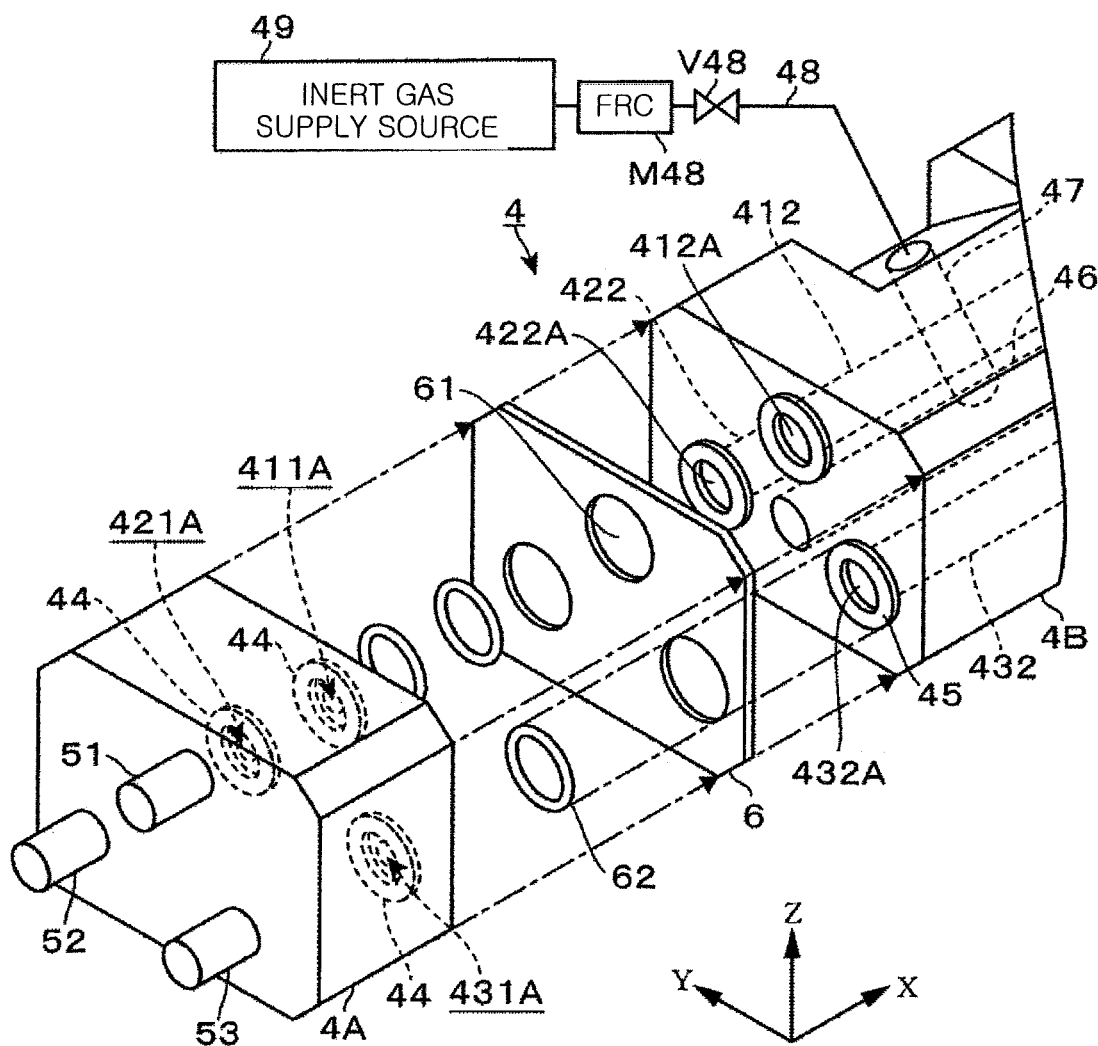
FIG. 2 is an exploded perspective view showing an example of a sealing structure of a gas supply line assembly in the vacuum processing apparatus.
Figure 3:
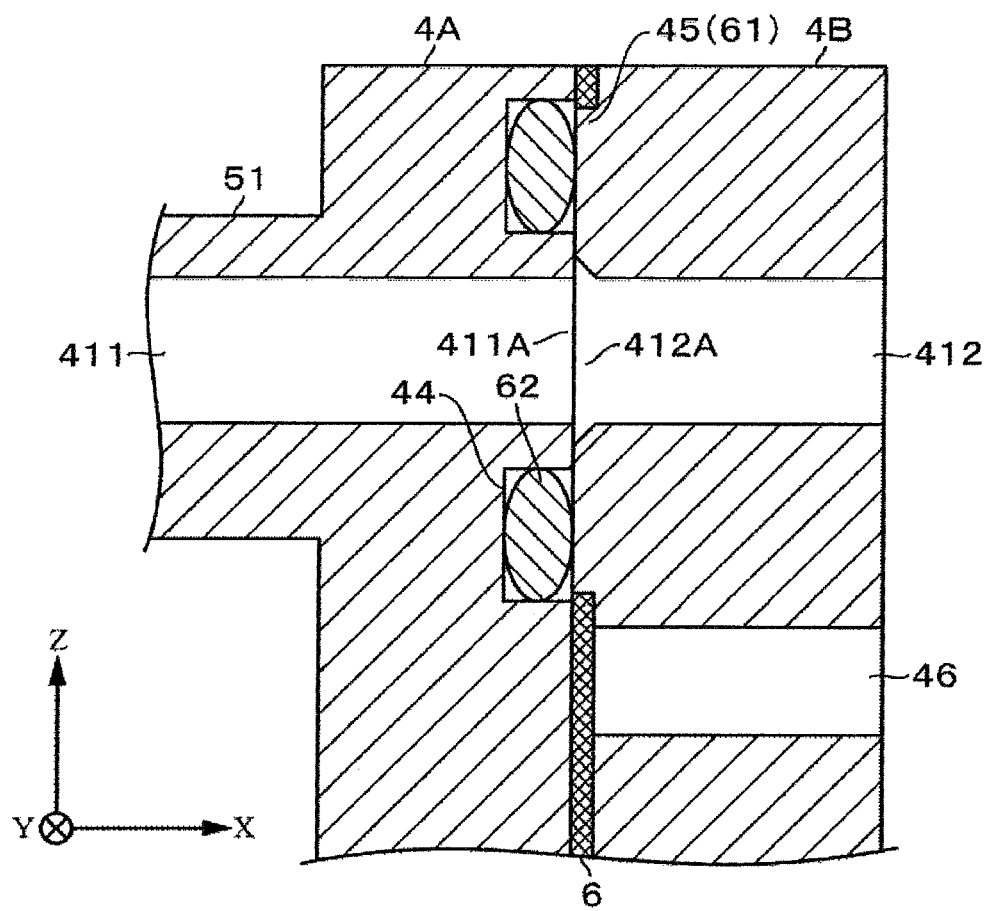
FIG. 3 is a vertical cross-sectional view of the sealing structure.
Figure 4:
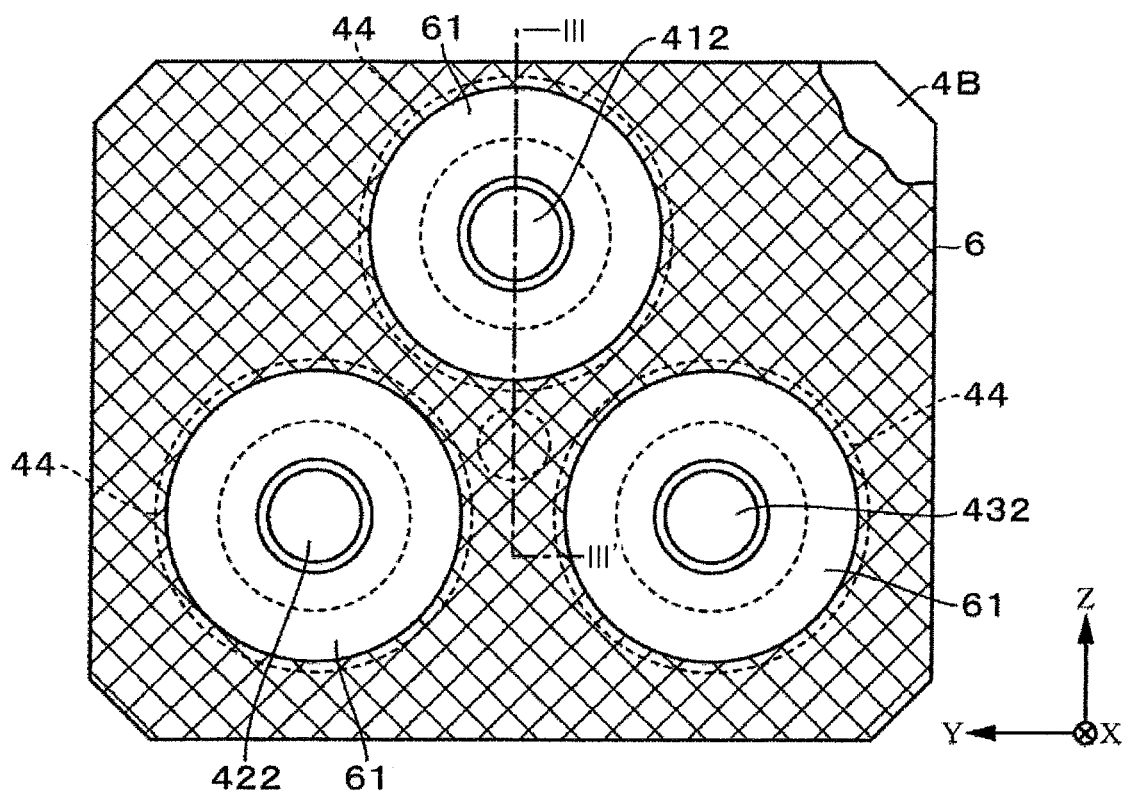
FIG. 4 is a front view of the sealing structure.

Next, the gas supply line assembly 4 for supplying a gas to the mixing unit 5 will be described with reference to FIGS. 2 to 4. FIG. 2 is an exploded perspective view of the sealing structure provided in the gas supply line assembly 4. FIG. 4 is a front view of a disassembled surface of the gas supply line assembly 4 when viewed from the X-axis direction shown in FIG. 2. FIG. 3 is a vertical cross-sectional view of the gas supply line assembly 4 taken along a line shown in FIG. 4. As shown in FIG. 1, the gas supply line assembly 4 is formed by connecting a plurality of pipe members and has therein three gas channels 41 to 43. Further, a sealing structure is formed to prevent inflow of air into each of the gas channels 41 to 43 from the connecting portions of the pipe members when the pipe members are connected to each other. In the gas supply line assembly 4 of the present embodiment, a pipe member disposed at the most downstream side to be connected to the mixing unit 5 is referred to as "first pipe member 4A" and a pipe member connected to the first pipe member 4A is referred to as "second pipe member 4B." Hereinafter, the sealing structure including the first pipe member 4A and the second pipe member 4B for sealing between the first pipe member 4A and the second pipe member 4B will be described.

The first pipe member 4A is a block-shaped member having a rectangular surface intersecting with a gas flow direction and has three gas channels 411, 421, and 431 formed therethrough. In FIG. 2, the illustration of the gas channels 411, 421, and 431 in the first pipe member 4A are omitted to avoid the complexity of the illustration. As shown in FIGS. 1 and 2, gas inlet lines 51 to 53 for introducing the gas supplied from the gas supply line assembly 4 into the mixing unit 5 are formed at the downstream ends of the gas channels 411, 421, and 431, respectively. Further, as shown in FIG. 2, openings 411A, 421A, and 431A corresponding to the end portions of the three gas channels 411, 421, and 431 are formed on the upstream end surface of the first pipe member 4A. As described above, the first pipe member 4A constitutes the gas supply line assembly 4 and has an end surface where the openings 411A, 421A, and 431A of the gas channels 411, 421, and 431 communicating with the vacuum chamber 10 are formed when viewed from the upstream side of the gas flow direction.

Among the three openings 411A, 421A, and 431A, one is formed near an upper part of the end surface and two are formed side by side near a lower part of the end surface. The three openings 411A, 421A, and 431A are arranged to surround the center of the end surface. Annular grooves 44 into which O-rings 62 as sealing members are respectively inserted are formed on the end surface to respectively surround the openings 411A, 421A, and 431A.

As shown in FIGS. 1 and 2, the second pipe member 4B is a block-shaped member having a substantially rectangular surface intersecting with the gas flow direction. The second pipe member 4B has a facing surface facing the end surface of the first pipe member 4A. Gas channels 412, 422, and 432 are formed through the second pipe member 4B. At the downstream ends of the gas channels 412, 422, and 432, openings 412A, 422A, and 432A are formed on the facing surface to correspond to the three openings 411A, 421A, and 431A formed on the end surface of the first pipe member 4B. Tapered portions that widen opening surfaces are formed at the peripheral portions of the openings 412A, 422A, and 432A of the second pipe member 4B, respectively. With this configuration, as can be seen from the enlarged view of FIG. 3, the opening 411A (421A, 431A) of the first pipe member 4A can be disposed inside the opening 412A (422A, 432A) of the second pipe member 4B.

As shown in FIGS. 2 and 3, annular convex contact portions 45 to be in contact with the O-rings 62 are formed to respectively surround the openings 412A, 422A, and 432A on the facing surface of the second pipe member 4B. An outer diameter of each of the contact portions 45 is set to be slightly smaller than an outer diameter of each of the grooves 44 formed at the first pipe member 4A. A height of each of the contact portions 45 is substantially the same as a thickness of a porous member 6 to be described later.

Further, as shown in FIGS. 2 and 3, an inert gas supply line 46 is formed through the second pipe member 4B at the substantially central portion of the second pipe member 4B that is surrounded by the gas channels 412, 422, and 432. An inert gas (e.g., Ar gas) that has less effect on the processing in the vacuum chamber 10 is supplied from the inert gas supply line 46. An inert gas inlet line 47 is formed to communicate with the inert gas supply line 46 from the upper surface of the second pipe member 4B (see FIG. 2). An inert gas supply source 49 is connected to the inert gas inlet line 47 through an inert gas supply line 48. In FIG. 2, a reference numeral V48 indicates a valve, and a reference numeral M48 indicates a flow rate controller (FRC). The inert gas supply line 46 corresponds to an inert gas supply unit for supplying an inert gas toward one surface (surface facing the second pipe member 4B) of the porous member 6 to be described later.

The O-rings 62 are disposed between the end surface of the first pipe member 4A and the facing surface of the second pipe member 4B to respectively surround the openings 412A, 422A, and 432A. Each of the O-rings 62 is made of perfluoroelastomer and has an annular shape. The O-rings 62 are respectively inserted into the grooves 44 of the first pipe member 4A. When the first pipe member 4A and the second pipe member 4B are connected, the O-rings 62 are pressed by the connecting portions 45 on the second pipe member 4B side. Accordingly, the O-rings 62 can be brought into contact with bottom surfaces of the grooves 44 (i.e., surfaces facing the facing surface of the second pipe member 4B in the grooves 44) and the contact portions 45.

Figure 5:
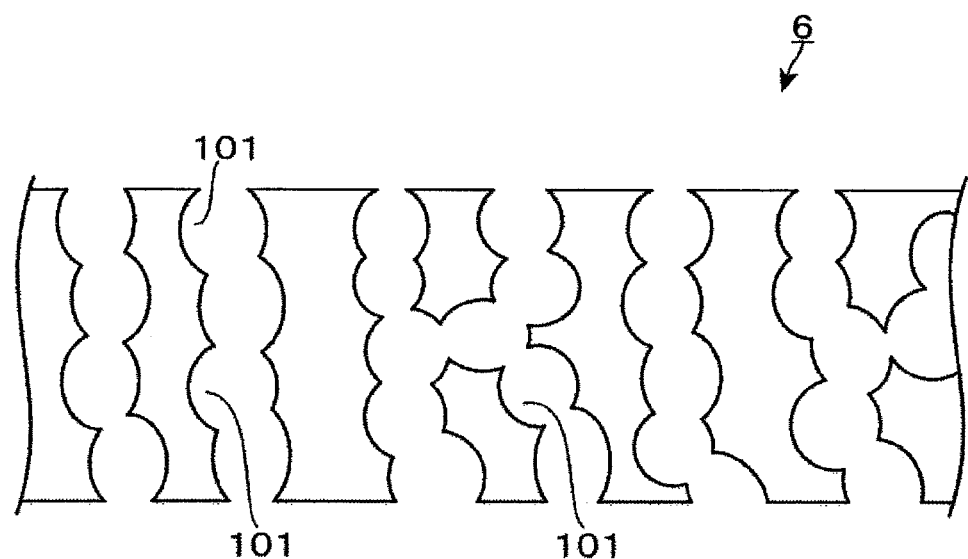
FIG. 5 is an enlarged cross-sectional view of a porous member used in the sealing structure.

Further, the porous member 6 is disposed between the end surface of the first pipe member 4A and the facing surface of the second pipe member 4B. Referring to FIGS. 4 and 5, the porous member 6 is made of, e.g., a porous metal and has a sheet shape having a thickness of, e.g., 0.02 mm to 5 mm. The porous metal is made of a metal, e.g., aluminum, titanium, copper, SUS (stainless steel), or the like. As shown in FIG. 5, a plurality of pores 101 is formed in the porous metal.

The pore diameter distribution or the porosity of the pores 101 can be controlled in a porous metal manufacturing process. The pores 101 have an average pore diameter of, e.g., 0.04 μm to 500 μm. As shown in FIG. 5, the porous member 6 of the present example preferably has a structure in which the pores 101 formed therein anisotropically communicate with each other toward a thickness direction of the porous member 6. The case where the pores 101 anisotropically communicate with each other does not indicate only the case where the pores 101 formed in the porous member 6 communicate with each other in the thickness direction. As shown in FIG. 5, for example, some of the pores 101 may communicate with each other in a planar direction when there is no flow path penetrating through the porous member 6 in the planar direction.

As shown in FIGS. 2 to 4, the porous member 6 has holes 61, each having a size corresponding to the outer diameter of each of the contact portions 45. The porous member 6 extends from the outer peripheries of the grooves 44 to a periphery of a facing region where the end surface and the facing surface face each other. At the end surface of the first pipe member 4A, the O-rings 62 are inserted into the grooves 44. At the facing surface of the second pipe member 4B, the porous member 6 is disposed such that the contact portions 45 are inserted into the holes 61. The first pipe member 4A and the second pipe member 4B are connected by aligning the positions of the openings 411A, 421A, and 431A that are opened on the end surface with the positions of the openings 412A, 422A, and 432A that are opened on the facing surface. At this time, as shown in FIG. 4, the porous member 6 is disposed between the end surface of the first pipe member 4A and the facing surface of the second pipe member 4B to surround the vicinity of the O-rings 62. Since outer diameters of the grooves 44 into which the O-rings 62 are respectively inserted are greater than outer diameters of the contact portions 45, i.e., inner diameters of the holes 61 of the porous member 6, the porous member 6 around each of the holes 61 is exposed to the space surrounded by each of the grooves 44 as shown in FIGS. 3 and 4.

As shown in FIG. 1, a titanium tetrachloride ($TiCl_4$) gas supply source 54, an ammonia ($NH_3$) gas supply source 55, and an argon (Ar) gas (replacement gas) supply source 56 are disposed at the upstream ends of the gas channels 41 to 43, respectively. In the case of forming a silicon (Si)-based film, a nitrogen ($N_2$) gas supply source, a monosilane ($SiH_4$) gas supply source, or a disilane ($Si_2H_6$) gas supply source are provided. In FIG. 1, reference numerals V41 to V43 in the gas channels 41 to 43 indicate valves, and reference numerals M41 to M43 indicate flow rate controllers (FRC). Further, the gas supply line assembly 4 is heated by, e.g., a tape heater (not shown).

Next, the operation of the film forming apparatus of the present disclosure will be described. For example, in the case of performing a film formation using a film forming apparatus, before the wafer W is loaded into the film forming apparatus, the mounting table 2 is heated to a set temperature, and the vacuum chamber 10 and the gas supply line assembly 4 are heated to set temperatures. In the film forming apparatus of the present disclosure, Ar gas is supplied to the inert gas supply line 46 and then to the porous member 6.

The Ar gas supplied to the porous member 6 tends to flow from the Ar gas supply position toward the peripheral portion along the surface of the porous member 6. Here, as shown in FIG. 5, in the porous member 6 of the present example, a large number of pores 101 communicate with each other in the thickness direction, whereas a smaller number of pores 101 communicate in the planar direction. The gap between the porous member 6 and the first and the second pipe member 4A and 4B is extremely small. In other words, the conductance of the gas flow in the planar direction of the sheet-shaped porous member 6 is high in the region where the porous member 6 is disposed.

Figure 6:
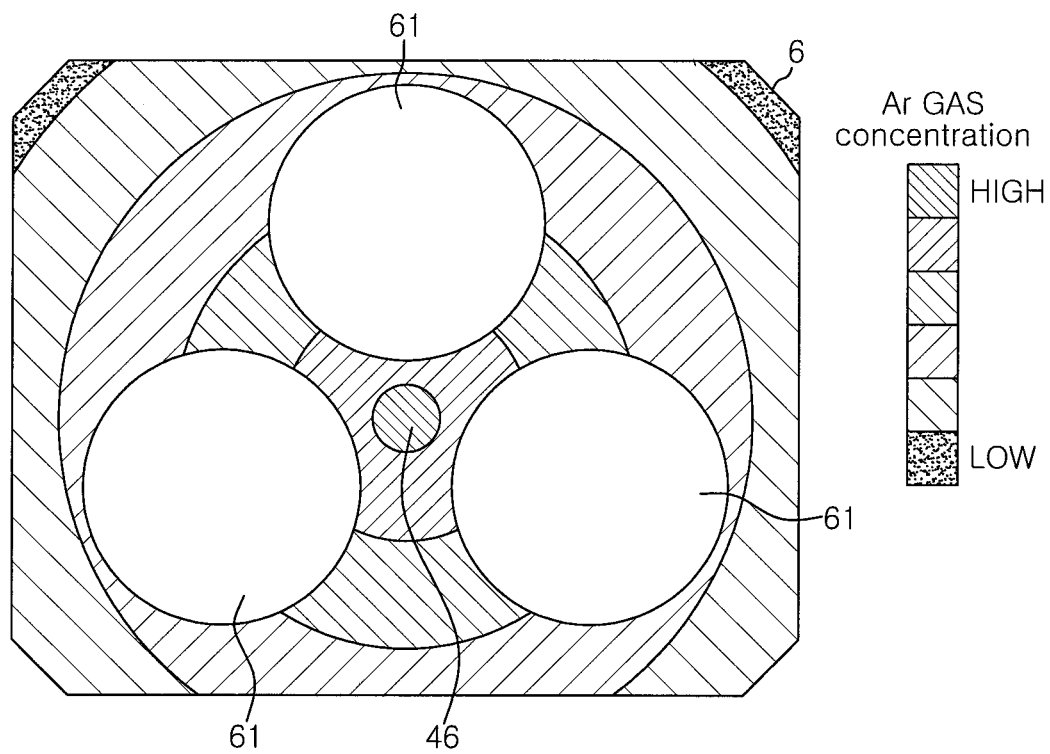
FIG. 6 explains an operation of the sealing structure.

When the gas is supplied from the center of the porous member 6, the gas flows through the gap between the facing surface of the second pipe member 4B and the surface of the porous member 6 and enters the pores 101 of the porous member 6. At this time, the gas hardly flows in the planar direction in the porous member 6, so that the concentration of Ar gas becomes high near the gas supply position. The concentration of Ar gas in the porous member 6 becomes low as the distance from the gas supply position increases. In other words, the concentration of air flowing from the outside is relatively high in the region distant from the gas supply position, whereas the concentration of air flowing from the outside is low near the gas supply position. Accordingly, as shown in FIG. 6, a concentration gradient in which the concentration of Ar gas entering the porous member 6 increases from the outer edge of the porous member 6 toward the Ar gas supply position is formed. FIG. 6 shows an image of the Ar gas concentration gradient, but it is not an accurate concentration gradient.

In the conventional sealing structure, the porous member 6 is not provided, so that air therearound easily reaches the vicinity of the O-rings 62 through the gap between the first pipe member 4A and the second pipe member 4B, compared to the above-described structure. Therefore, the concentration of air tends to be high even around the O-rings 62. The O-rings 62 may allow a part of components of the air to penetrate therethrough. Accordingly, when the concentration of air around the O-rings 62 becomes high, oxygen or nitrogen that is the component of the air may enter the gas supply line assembly 4 (vacuum chamber 10).

In the case of heating the vacuum chamber 10 or the first and second pipe members 4A and 4B, the penetration of air through the O-rings 62 can be facilitated by the thermal transpiration effect that induces movement of molecules due to the heating.

If air enters the vacuum chamber 10 and oxygen is mixed with a film forming gas due to the above circumstances, a problem such as oxidation of a formed film or the like may occur.

In order to solve such problems, in the film forming apparatus of the present disclosure, the porous member 6 is disposed around the O-rings 62 so that the conductance of the gas flowing between the first pipe member 4A and the second pipe member 4B become high. As a result, even if air enters the gap between the first pipe member 4A and the second pipe member 4B, it is difficult for the air to reach the central region of the porous member 6 where the O-rings 62 are disposed. By decreasing the concentration of the air around the O-rings 62, it is possible to suppress the inflow of the air into the vacuum chamber 10 through the O-rings 62. Unlike a known gasket, the porous member 6 does not necessarily have a function of disturbing gas flow while being in contact with the end surface of the first pipe member 4A or the facing surface of the second pipe member 4B.

In the film forming apparatus of the present disclosure, the concentration gradient in which the concentration of Ar gas becomes higher from the outer edge of the porous member 6 toward the Ar gas supply position is generated by supplying Ar gas toward the porous member 6. Therefore, it is difficult for air to reach the region closer to the central region close to the Ar gas supply position. Accordingly, it is more difficult for air to reach the O-rings 62, which makes it possible to suppress the inflow of air into the gas supply line assembly 4 more effectively.

In the film forming apparatus in which the mounting table 2, the vacuum chamber 10 and the gas supply line assembly 4 are heated and the Ar gas is supplied to the porous member 6, the gate valve 15 is opened, and the wafer W is loaded into the vacuum chamber 10 and mounted and heated on the mounting table 2. Then, the gate valve 15 is closed and the pressure in the vacuum chamber 10 is adjusted to a predetermined pressure. Next, $TiCl_4$ gas and Ar gas are supplied from the $TiCl_4$ gas supply source 54 and the Ar gas supply source 56, respectively. The $TiCl_4$ gas and the Ar gas are supplied to the mixing unit 5 through the gas supply line assembly 4 and mixed in the mixing unit 5. The mixed gas is supplied into the vacuum chamber 10 through the shower head 3. Accordingly, $TiCl_4$ is adsorbed on the surface of the wafer W.

Then, in a state where the Ar gas is supplied, the supply of the $TiCl_4$ gas is stopped and the atmosphere in the vacuum chamber 10 is replaced. Thereafter, $NH_3$ gas and Ar gas are supplied. Therefore, the $TiCl_4$ adsorbed on the surface of the wafer W reacts with $NH_3$ to form a titanium nitride (TiN) molecular layer. In this manner, the reaction gas ($TiCl_4$ gas, $NH_3$ gas) and the replacement gas (Ar gas) are supplied in the order of $TiCl_4$ gas→Ar gas→$NH_3$ gas→Ar gas. Accordingly, the TiN molecular layer formed on the surface of the wafer W is laminated to form a TiN film.

In the film forming apparatus of the present example, gases are supplied to the vacuum chamber 10 through the gas supply line assembly 4 formed by connecting a plurality of members (the first pipe member 4A and the second pipe member 4B) through which the three gas channels 411 (412), 421 (422), and 431 (432) penetrate and having relatively large connecting surfaces (end surface and facing surface). Since the inflow of air is suppressed by the above-described sealing structure regardless of the presence of the gas supply line assembly 4 configured as described above, the inflow of air into the vacuum chamber 10 is suppressed, which makes it possible to suppress the decrease in the film quality, such as oxidation of the TiN film or the like.

In accordance with the above-described embodiment, elastomer (elastic polymer) O-rings 62 are disposed between the end surface of the first pipe member 4A, where the openings 411A, 421A, and 431A corresponding to the end portions of the gas channels 411, 421, and 431 communicating with the vacuum chamber 10 are formed, and the facing surface of the second pipe member 4B, where the openings 412A, 422A, and 432A corresponding to the end portions of the gas channels 412, 422, 432 are formed, to surround the openings. The raw material for the elastomer may be, e.g., perfluoroelastomer, fluororubber, or the like. Further, the porous member 6 is disposed between the end surface of the first pipe member 4A and the facing surface of the second pipe member 4B to surround the vicinity of the O-rings 62. Therefore, the conductance of the gas flowing between the end surface of the first pipe member 4A and the facing surface of the second pipe member 4B becomes high, and it is difficult for air outside of the gas supply line assembly 4 to reach the vicinity of the O-rings 62. Accordingly, the inflow of air into the vacuum chamber 10 through the O-rings 62 can be suppressed.

Further, Ar gas is supplied to the porous member 6 to generate a concentration gradient in which the concentration of the Ar gas increases from the outer edge of the porous member 6 toward the Ar gas supply position. Therefore, it is difficult for air to reach the region closer to the central region close to the Ar gas supply position. Accordingly, it is more difficult for air to reach the O-rings 62, which makes it possible to suppress the inflow of air into the gas supply line assembly 4.

As an example of the conventional sealing structure, there is a known structure in which an inner O-ring 62 and an outer O-ring 62 are disposed around each of the openings 411A, 421A, and 431A. In this case, an attempt is made to suppress the inflow of air by supplying a gas to the gap between the two O-rings 62 or by removing the atmosphere between the two O-rings 62. However, it may be difficult to arrange the two O-rings 62 in, e.g., a place where the gas channels are densely disposed. Accordingly, the scaling up of the apparatus may be required to secure the space for the two O-rings 62.

In the sealing structure of the present disclosure, only one O-ring 62 is disposed around each of the openings 411A, 421A, and 431A, which makes it possible to provide the O-ring 62 in a place where pipes or the like are densely disposed without scaling up the apparatus.

The porous member 6 may be made of a metal material, a brittle material, or a resin material. The metal material may be, e.g., a porous metal, a sintered metal, or a fibrous metal. The brittle material may be porous quartz or porous ceramic, an aggregate of mica, or fibrous mineral. The resin material may be a foam material such as an elastomer or a fluororesin, or a filter-shaped material such as an aggregate of wires. The resin material may be a porous resin or a porous film.

In order to more reliably increase the conductance of the gas in the planar direction of the porous member 6, it is preferred that the pores 101 anisotropically communicate with each other in the thickness direction of the porous member as described above.

Further, in order to more effectively prevent air from reaching the O-rings 62, the porous member 6 preferably extends from the outer peripheries of the grooves 44 to the periphery of a facing region where the end surface and the facing surface face each other. Further, an opening for introducing the inert gas into the porous member 6 may be formed at a position of the porous member 6 to which the inert gas is supplied. In addition, a gap for diffusing the gas toward the peripheral portion of the porous member 6 may be formed near the opening for introducing the inert gas.

Further, the grooves 44 may be formed either on the end surface of the first pipe member 4A or on the facing surface of the second pipe member 4B. The grooves 44 may be formed on both of the end surface of the first pipe member 4A and the facing surface of the second pipe member 4B as long as the accurate position alignment between the first pipe member 4A and the second pipe member 4B can be performed and the O-rings 62 can be reliably pressed.

Further, when the first pipe member 4A and the second pipe member 4B are connected, air may be filled in the grooves 44. Then, the air remaining in the grooves 44 may enter the gas supply line assembly 4 through the O-rings 62. Therefore, as shown in FIG. 3, the porous member 6 may be exposed to the space of the grooves 44 into which the O-rings 62 are inserted. With this configuration, the inert gas supplied to the porous member 6 can reach the grooves 44 and be replaced with the air filled in the grooves 44. Even when the inert gas is not supplied, the air in the grooves 44 can be made to enter the porous member 6 and be diffused toward the outside.

Figure 7:
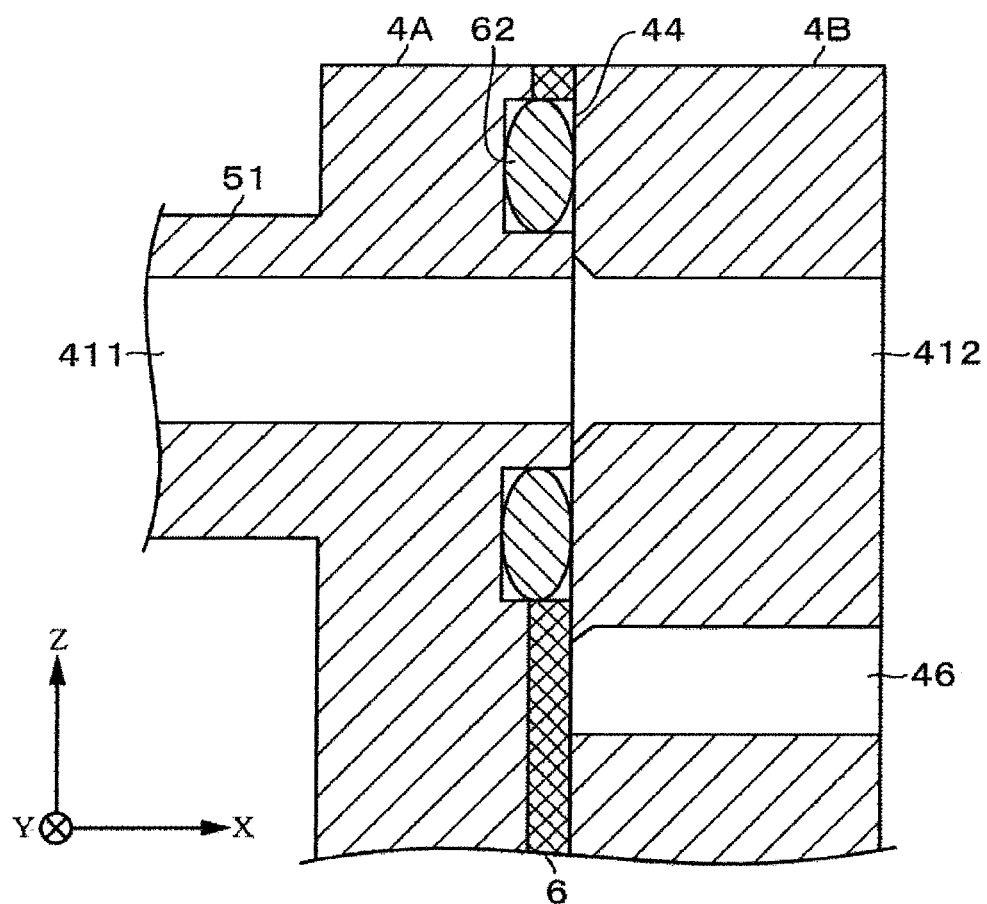
FIG. 7 is a vertical cross-sectional view showing another example of the sealing structure according to the embodiment.

In addition, as shown in FIG. 7, the porous member 6 may form at least a part of the outer peripheral wall of each groove 44. Even with this configuration, the porous member 6 is exposed toward the grooves 44, so that the air filled in the grooves 44 can be removed by the above-described operation.

Further, the above-described sealing structure of the present disclosure may be applied to a plasma processing apparatus. Further, the sealing structure of the present disclosure may be applied to an etching apparatus as well as a film forming apparatus. In addition, the sealing structure of the present disclosure may be applied to various apparatuses for processing a substrate in a vacuum atmosphere.

Since the O-rings 62 tend to allow a gas to penetrate therethrough at a high temperature as described above, the sealing structure of the present disclosure can be effectively applied to an apparatus in which the vacuum chamber 10 or the gas supply line assembly 4 is heated.

Figure 8:
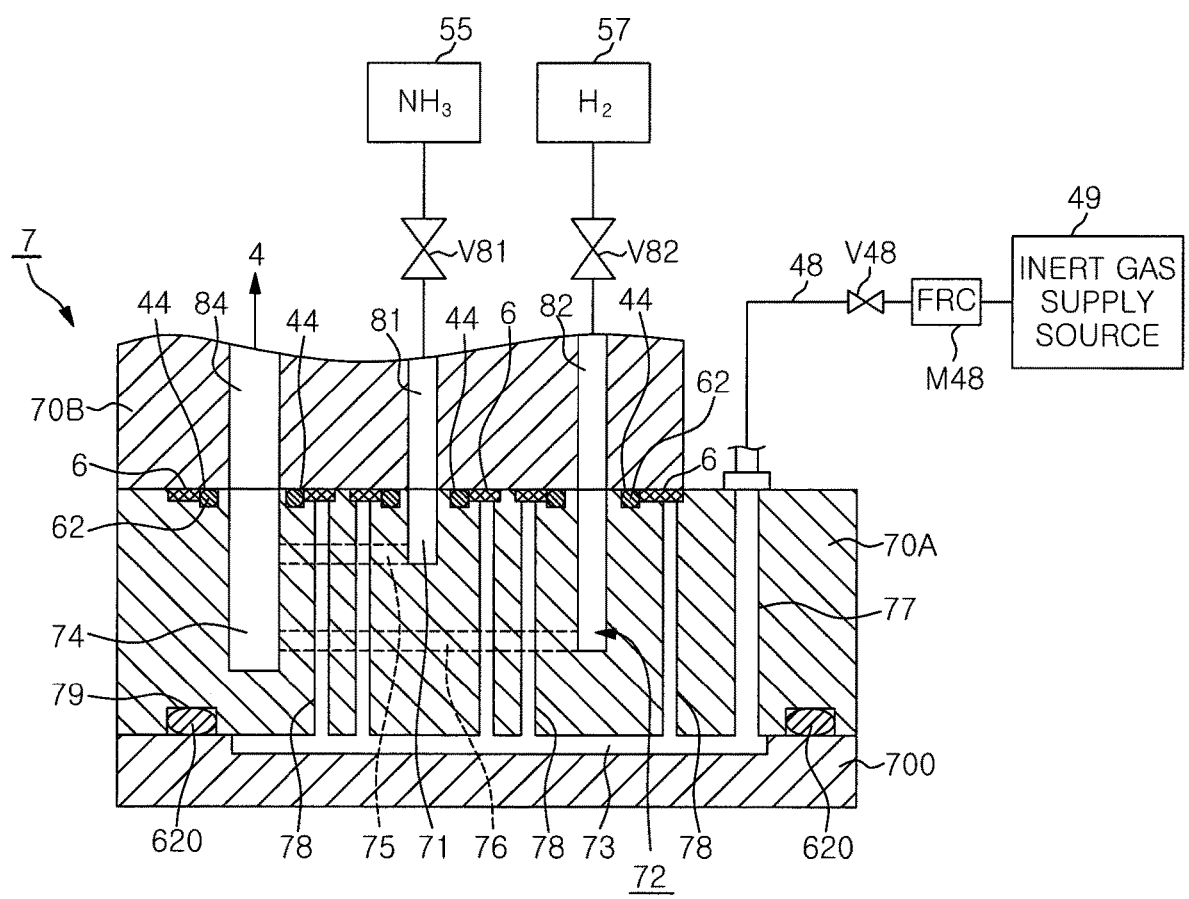
FIG. 8 is a vertical cross-sectional view showing still another example of the sealing structure.

Next, another example of the sealing structure of the present disclosure will be described. In the film forming apparatus shown in FIG. 1, for example, a mixing unit for pre-mixing gases supplied from the gas supply sources may be disposed at the upstream side of the gas supply line assembly 4. FIG. 8 shows an example of such a mixing unit 7. In the following example, the case where $NH_3$ gas and $H_2$ gas are pre-mixed and supplied to the gas supply line assembly 4 in the plasma processing apparatus will be described. The mixing unit 7 in the present example corresponds to the gas supply line assembly.

The mixing unit 7 includes, e.g., a block-shaped first pipe member 70A. An $NH_3$ gas channel 71, an $H_2$ gas channel 72, and a gas supply line 74 are formed through the first pipe member 70A such that openings thereof are formed on the upper surface of the first pipe member 70A. Further, gas inlet lines 75 and 76 are formed in the first pipe member 70A to introduce the gases respectively flowing into the $NH_3$ gas channel 71 and the $H_2$ gas channel 72 into the gas supply line 74. Annular grooves 44 into which the O-rings 62 are respectively inserted are formed on the upper surface of the first pipe member 70A to surround the openings of the gas supply line 74, the $NH_3$ gas channel 71 and the $H_2$ gas channel 72.

The mixing unit 7 includes a second pipe member 70B having a facing surface facing the upper surface (end surface) of the first pipe member 70A. Gas channels 81, 82, and 84 are formed through the second pipe member 70B. Openings that are opened toward the facing surface are respectively formed at the lower ends of the gas channels 81, 82, and 84. The openings of the gas channels 81, 82, and 84 are formed to respectively correspond to the three openings formed at the end surface of the first pipe member 70A. An $NH_3$ gas supply source 55 for supplying $NH_3$ gas and an $H_2$ gas supply source 57 for supplying $H_2$ gas to the gas channels 81 and 82, respectively, are connected to the upstream side of the second pipe member 70B. Reference numerals V81 and V82 in FIG. 8 indicate valves.

In the mixing unit 7, $NH_3$ gas from the $NH_3$ gas source 55 and $H_2$ gas from the $H_2$ gas source 57 are mixed in the gas supply line 74 and supplied to the gas supply line assembly 4.

In the above-described mixing unit 7, the sheet-shaped porous member 6 is disposed to surround the vicinity of the O-rings 62, and the first pipe member 70A and the second pipe member 70B are connected with the porous member 6 provided therebetween.

As in the case of the mixing unit 7 of the present example, when the gas channels are densely formed on the upper surface of the first pipe member 70A, it is difficult to provide one sheet-shaped porous member 6 due to the dense distribution of the openings. In this case, as shown in FIG. 8, the annular porous member 6 may be disposed for each of the grooves 44 where the O-rings 62 are disposed to form an outer peripheral wall of each of the grooves 44.

In the mixing unit 7 of the present example, a plurality of inert gas supply lines 78 for supplying an inert gas to the porous members 6 are formed through the first pipe member 70A in a vertical direction. For each porous member 6, one inert gas supply line 78 or two or more inert gas supply lines may be provided.

Further, an inert gas inlet line 77 through which the inert gas introduced from the upper surface of the first pipe member 70a flows is formed through the first pipe member 70A in the vertical direction. An inert gas supply line 48 for supplying an inert gas from the inert gas supply source 49 is connected to the inert gas inlet line 77 and is configured to supply the inert gas toward an inert gas distribution space. In FIG. 8, a reference numeral V48 indicates a valve, and a reference numeral M48 indicates a flow rate controller (FRC).

Further, a distribution space forming member 700 for forming the inert gas distribution space for communicating the inert gas inlet line 77 with the inert gas supply lines 78 is disposed on the bottom surface of the first pipe member 70A. The distribution space forming member 700 has a recess 73 that is opened toward the upper surface. The first pipe member 70A and the distribution space forming member 700 are connected so that the lower ends of the inert gas inlet line 77 and the inert gas supply lines 78 are opened toward the recess 73.

With the above-described configuration, the inert gas supplied from the inert gas inlet line 77 is distributed to the inert gas supply lines 78 and then supplied to the porous members 6.

Similarly, in the present example, the concentration gradient in which the concentration of the Ar gas entering each of the porous members 6 increases from the outer edge of each of the porous members 6 toward the Ar gas supply position can be formed around the corresponding O-ring 62. Accordingly, the concentration of air that reaches the vicinity of the O-rings 62 from the outside can be reduced, which makes it possible to obtain the effects of the present disclosure.

As shown in FIG. 8, a groove 79 is formed on the bottom surface of the first pipe member 70A to surround the recess 73 formed at the distribution space forming member 700, and the O-ring 620 is disposed in the groove 79. Here, the inert gas distribution space is not a vacuum exhaust path and is in a slightly pressurized state, so that the porous member 6 may not be disposed on the contact surface between the bottom surface of the first pipe member 70A and the distribution space forming member 700.

Even in the case of the mixing unit 7 having the above-described configuration, the inflow of air into the mixing unit 7 can be suppressed by providing the sealing structure of the present disclosure including the first pipe member 70A and the second pipe member 70B for sealing between the first pipe member 70A and the second pipe member 70B.

Accordingly, it is possible to obtain the same effect as that obtained by the sealing structure of the gas supply line assembly 4 described with reference to FIGS. 2 to 7.

The presently disclosed embodiments of the present disclosure are considered in all respects to be illustrative and not restrictive. The above-described embodiments can be embodied in various forms. Further, the above-described embodiments may be omitted, replaced, or changed in various forms without departing from the scope of the appended claims and the gist thereof.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A sealing structure of a gas supply line assembly connected to a processing chamber of a vacuum processing apparatus for processing a substrate, comprising:
   a first pipe member constituting the gas supply line assembly and having an end surface where an opening communicating with the processing chamber is formed;
   a second pipe member constituting the gas supply line assembly and having a facing surface facing the end surface of the first pipe member;
   a sealing member made of an elastomer disposed between the end surface of the first pipe member and the facing surface of the second pipe member to surround the opening; and
   a sheet-shaped porous member disposed between the end surface of the first pipe member and the facing surface of the second pipe member to surround a vicinity of the sealing member, wherein the sealing member is disposed in a groove formed on either the end surface or the facing surface, and
   the sheet-shaped porous member extends from an outer periphery of the groove to a periphery of a facing region where the end surface and the facing surface face each other.

2. The sealing structure of claim 1, further comprising:
   an inert gas supply unit configured to supply an inert gas toward one surface of the sheet-shaped porous member,
   wherein a concentration gradient in which a concentration of the inert gas entering the sheet-shaped porous member increases from an outer edge of the sheet-shaped porous member toward a position where the inert gas is supplied.

3. The sealing structure of claim 1, wherein the sheet-shaped porous member is exposed to a space surrounded by the groove.

4. The sealing structure of claim 1, wherein a plurality of pores formed in the sheet-shaped porous member anisotropically communicate with each other in a thickness direction of the sheet-shaped porous member.

5. The sealing structure of claim 1, wherein the sheet-shaped porous member is a porous metal or a fibrous metal.

6. The sealing structure of claim 1, wherein the sheet-shaped porous member is a porous resin.

7. The sealing structure of claim 1, wherein
   a heating unit configured to heat the processing chamber of the vacuum processing apparatus.

* * * * *